United States Patent [19]

Saroul

[11] Patent Number: 4,544,881
[45] Date of Patent: Oct. 1, 1985

[54] DEVICE FOR TESTING THE INSULATION OF PRINTED CIRCUITS

[75] Inventor: Jacques Saroul, Valence, France

[73] Assignee: Crouzet, Paris, France

[21] Appl. No.: 462,779

[22] Filed: Feb. 1, 1983

[30] Foreign Application Priority Data

Feb. 10, 1982 [FR] France .................. 82 02287

[51] Int. Cl.$^4$ ............................................ G01R 31/28
[52] U.S. Cl. ................................................ 324/73 PC
[58] Field of Search ........... 324/51, 54, 73 PC, 158 P, 324/158 F

[56] References Cited

U.S. PATENT DOCUMENTS 3,684,960  8/1972  Conley ............................ 324/158 P

OTHER PUBLICATIONS

Renz: "Multipoint Probe for PC Boards"—IBM Tech. Discl.—vol. 17—No. 2—Jul. 1974—pp. 459-460.
Reis: "Circuit Board . . . Test Method"—IBM Tech. Discl.—vol. 20—No. 12—May 1978—pp. 5258-5259.
Zobniw: "Orthogonal Shorts Detector"—IBM Tech. Discl.—vol. 22—No. 7—Dec. 1979—pp. 2704-2705.

Primary Examiner—Stanley T. Krawczewicz
Assistant Examiner—Jose M. Solis
Attorney, Agent, or Firm—Holman & Stern

[57] ABSTRACT

The present invention relates to devices for the quality control of the electrical insulation of printed circuits made in particular in multiple layers superposed on insulating supports of laminar structure by means of conventional or hybrid technologies. To this end, the testing device according to the invention essentially comprises: a specific sensor circuit constituted by a supple insulating screen comprising a plurality of conducting studs with one and only one stud for each conductive printed circuit path; a scanning circuit associated with said sensor circuit comprising a metallized insulating layer having at least two coplanar conducting zones insulated by at least one transverse electrical discontinuity; a measuring apparatus indicative of the galvanic insulation existing between two contiguous conducting zones of said scanning circuit. The testing is performed by moving the scanning circuit and detecting for a short between two intentionally separate conductive printed circuit paths which would close the circuit between the two conducting zones of the scanning circuit.

20 Claims, 3 Drawing Figures

DEVICE FOR TESTING THE INSULATION OF PRINTED CIRCUITS

BACKGROUND OF THE INVENTION

The present invention relates to devices for the quality control of the electrical insulation of printed circuits made in particular in multiple layers superposed on insulating supports of laminar structure by means of conventional or hybrid technologies.

It is well known in industrial circles specializing in the design and production of complex printed circuits that it is of great importance to reveal their defects in quality as soon as possible in the process of manufacture in order to avoid rejects which are all the more expensive as printed circuits have additional technological value and any flaw, particularly in insulation, proves most often to be irreparable.

With this concern which is essentially an economic one, the present state of the art in the quality control or testing of the functional insulation of multilayer printed circuits consists in employing a system of sensors incorporating elastic conducting tips simultaneously applied on each of the conducting contacts present on the accessible faces of the printed circuit to be tested. Each of these sensors is connected to an insulation indicator via a logic unit of selective—or combinative—interconnection of which the scanning program is specifically established as a function of the typical features of the printed circuit to be tested. The major drawback of this technique lies in the fact that it requires a sensor device with multiple tips whose configuration must be adapted to each particular model of printed circuit.

In fact, this embodiment which is always expensive and whose reliability is often problematic for adaptation to printed circuits of "normal" dimensions, becomes virtually impossible to produce in economically acceptable and technically reliable manner in the majority of industrial applications—particularly in the domain of aeronautical and space equipment—where, for reasons of compactness and circuit density, special printed circuits must be made whose structural characteristics do not correspond to any dimensional standard which would allow the same sensor device, adaptable to several different designs of printed circuits, to be used.

It is therefore an object of the present invention to propose an economical and reliable device for the quality control testing of the insulation of multilayer printed circuits of various types and configurations — including the most compact and the most complex obtained in hybrid technology—which does not have the drawbacks of the known systems requiring different sets of sensors with tips to be produced and employed.

SUMMARY OF THE INVENTION

To this end, the quality control testing device according to the invention essentially comprises:
- a specific sensor circuit constituted by a flexible insulating screen comprising a plurality of conducting studs of which the number and position coincide individually with the position of any one but only one of the conducting contacts of each of the "trees" of the printed circuit card or the like to be tested;
- a scanning circuit associated with said sensor circuit constituted by a metallized insulating layer presenting at least two coplanar conducting zones insulated by at least one transverse electrical discontinuity at the contact of which a movement of relative slide is effected of the integral assembly which results in the superposition of said specific sensor circuit on the corresponding test face of said printed circuit to be tested, and
- a measuring apparatus indicating the galvanic insulation existing between two contiguous conducting zones of said scanning circuit.

BRIEF DESCRIPTION OF THE DRAWINGS

The invention will be more readily understood on reading the following description with reference to the accompanying drawings, in which.

DESCRIPTION OF A PREFERRED EMBODIMENT OF THE INVENTION

Figure 1:
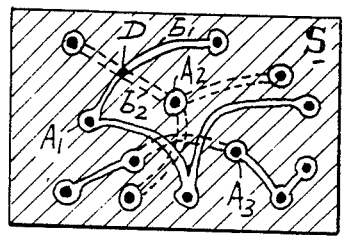
FIG. 1 is a standard printed circuit to be controlled, comprising a certain number of conducting "trees" implanted on each face.

Referring now to the drawings, a printed circuit of standard type—such as that shown much simplified in FIG. 1 for clarity of the specification—is constituted in conventional manner by a more or less rigid, flat laminar insulating support 1, of which one and the other of the faces are studded with an arranged plurality of metallic contact studs adherent to the support of which the majority are connected by conducting tracks so as to form an elaborate, complex network of electrical interconnections, in superposed layers. The complex printed circuit S has conducting elements each consisting of conducting tracks possibly extending over both sides of the printed circuit respectively, as shown in FIG. 1, and of contact studs in the form of so-called "holes with metallized wall".

The various ramifications of this network of interconnections are generally organized in distinct conducting assemblies which must be galvanically insulated from one another. These insulated assemblies then constitute "trees" whose respective "branches" may continue from one face to the insulating support to the other, via holes with metallized wall, made at the centre of each of the contacts and adapted furthermore to allow the connection by welding of the different components of an electronic circuit mounted on a board. The purpose of the invention is to rapidly check whether these conducting elements have any electrical connection therebetween, which is undesirable (i.e. a short between two "trees"), or not; that is, to check their galvanic insulation.

The problem of quality control of such a printed circuit essentially consists in quickly and reliably revealing the existence of a defect in insulation between two "trees".

Such a defect, which is virtually indiscernible by a visual examination, is assumed to exist by a fault in the insulating support at point D of intersection between two branches $b_1$ and $b_2$ of the two "trees" $A_1$ and $A_2$, as shown for example in FIG. 1.

In order to carry out this control, a specific sensor circuit has been produced, whose characteristics are defined at the design stage of the standard circuit.

Figure 2:
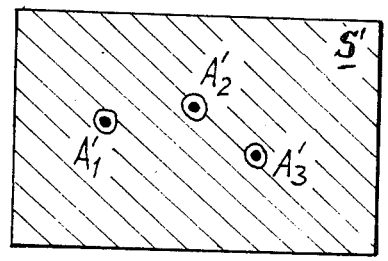
FIG. 2 is a specific sensor circuit comprising only one conducting stud per "tree" of the standard circuit of FIG. 1.

This specific sensor circuit or means, as illustrated in FIG. 2, comprises a thin, supple, insulating support on which there is only one conducting contact stud per "tree" of the standard circuit to be controlled.

Each of the contact studs of the sensor circuit is in strict register with any one but only one of the contact studs of each one of the "trees" of the standard circuit, and said contact stud is obtained by metallizing holes made in the supple support so as to have a plurality of tiny conducting studs on either side of an insulating screen. Specific sensor means S', as shown in FIG. 2 is to be superimposed onto the printed circuit S. Specific sensor means S' is an insulating screen with double-face conducting studs ($A_1'$, $A_2'$, $A_3'$), each of them when sensor means S' is superimposed on circuit S registering with just one ($A_1$ or $A_2$ or $A_3$) of the contact studs of each conducting element of printed circuit S.

These studs preferably have a structure similar to that of a rivet of which one of the heads is flat and of strictly defined diameter, whilst the other head is convex so as to project slightly above with respect to the corresponding face of the insulating screen.

According to a preferred technology, the insulating screen is made with polyimide film—for example such as KAPTON—metallization of the holes of which being obtained due to a photochemical process for locally depositing copper.

Constructed in this way, the specific sensor circuit is adapted to make it possible to establish with precision, due to the interposition of the supple insulating screen between the printed circuit "board" or the like to be tested and the scanning circuit, a selective and localized equipotential electrical contact between a determined conducting contact stud of each "tree" of the standard circuit to be tested and one or the other of the coplanar conducting zones of the scanning circuit which is also made on a supple insulating support of the polyimide type metallized on one face only and fixed by the opposite face to a compressible support plane of the polyurethane foam type.

The metallized face of the scanning circuit (FIG. 3) made, for example, by a deposit of copper, metal and gold to be rendered smooth and not subject to abrasion and corrosion, is constituted by two rectangular conducting zones of which the smaller side of a zone must be larger than the largest dimension of the standard circuit to be controlled.

These two conucting zones are galvanically insulated from each other by a rectilinear or winding transverse separating space of constant width in contact with and across which the assembly is maintained integral, and with the exact superposition of the standard printed circuit to be tested and of the supple sensor circuit which corresponds specifically thereto, and which is continuously moved (by a movement of relative slide exerted with a suitable elastic pressure).

To allow the device described hereinabove to operate, i.e., essentially, to enable the existence of defects in insulation between the different conducting "trees" of the printed circuits to be detected—and possibly located—, it is imperative that, on the one hand, the specific sensor circuit as defined hereinabove comprise only one equipotential contact stud for each of the "trees" of the standard printed circuit to be controlled and, on the other hand, that the diameter of the conducting contacts consfituting, on the same face, the flat heads of the studs of said sensor circuit, said face closed to said sensor circuit and its zones, said flat heads to be slightly smaller than the width of the insulating space separating two contiguous conducting zones of said scanning circuit.

The testing process is as follows:

1. The specific sensor circuit is superposed correctly on the standard printed circuit to be controlled, which corresponds thereto, so that their respective conducting contacts are in register.
2. The scanning circuit is then applied against the preceding assembly so that the conducting zones are brought into permanent and intimate contact with all the contact studs accessible on the outer face of said specific sensor circuit.
3. The measurement of insulation between two "trees" is effected in conventional manner for example with the aid of a megohmmeter connected between the insulated zones of the scanning circuit on each of which one of the sensor studs corresponding individually to a "tree" is respectively in contact.
4. A continuous movement of longitudinal translation by relative slide of the integrally superposed assembly (specific sensor circuit - printed circuit to be controlled) is imparted on the scanning circuit so that the rows of contact studs of the sensor circuit move in the insulating space separating the conducting zones of the scanning circuit.

A defect in insulation affecting two "trees" of the printed circuit is immediately and automatically detected and revealed by the insulation measuring and indicating apparatus since the two contact studs belonging respectively to each of the two mutually defective "trees" are located on either but different sides of the insulating space separating the conducting zones of the scanning circuit.

5. In order to obtain, if necessary, precise localization of the defect, the preceding operation of sliding translation in the transverse direction is repeated.

Let us assume that the two conducting elements of the printed circuit S, having contact studs $A_1$ and $A_2$, respectively, are not insulated from each other, that is they have two tracks $b_1$ and $b_2$, respectively, which are electrically connected in D, due to a defect in the insulated support of the printed circuit S.

Figure 3:
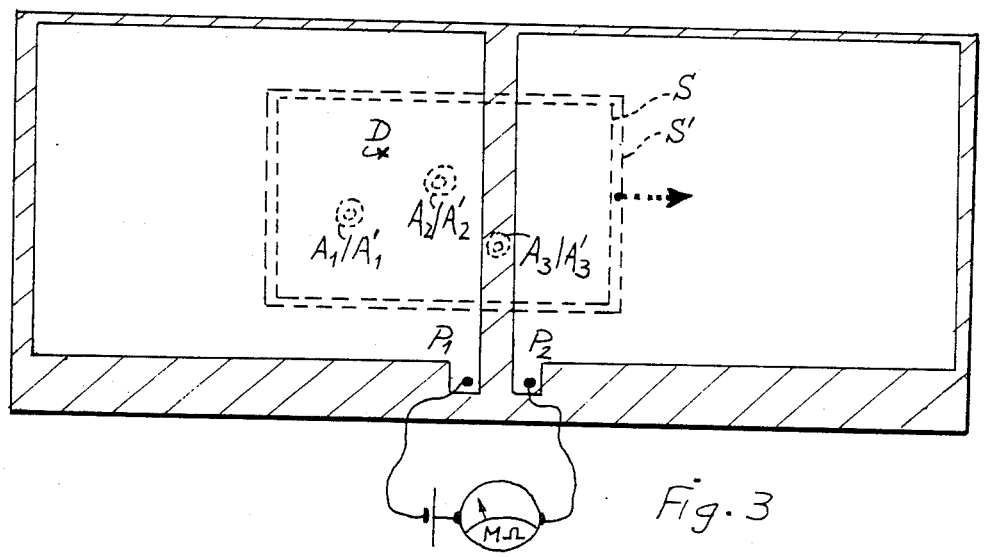
FIG. 3 is a scanning circuit comprising two coplanar superficial conducting zones galvanically insulated from each other by a rectilinear transverse discontinuity.

The device of the invention also comprises scanning means, shown in FIG. 3, provided with two separate and fixed conductive sections ($P_1$, $P_2$), or zones, which are to be slided, or moved in translation, over and along the sensor means S'. For this reason, it relates to "scanning" means.

Of course, each conducting stud of the sensor means S' has to be smaller, in diameter, than the width of the space between the two conductive sections of the scanning means.

The device of the invention further comprises indicator means (M$\Omega$), shown in FIG. 3, such as a megohmmeter, connected to both conductive sections ($P_1$, $P_2$) of the scanning means.

Upon sliding of the scanning means ($P_1P_2$) along the sensor means S', superimposed onto the printed circuit S, it comes a time when the insulated space between conductive sections $P_1$ and $P_2$ lies above point D, that is stud $A'_1$ and therefore stud $A_1$ is electrically connected with section $P_1$, and stud $A'_2$ and therefore stud $A_2$ is electrically connected with section $P_2$. Since the two sections $P_1$ and $P_2$ should never have been electrically connected whereas at this very time sections $P_1$ and $P_2$ are nevertheless electrically connected through D (D, $A_1$, $A'_1$, $P_1$ and D, $A_2$, $A'_2$, $P_2$), the indicating means indicates this and the defect is detected.

This is how the device of the invention operates.

It should be noted that checking of any defect with the instant invention can be achieved in moving the scanning means in just one direction. Moreover, the defect can be detected without having to localize this defect. It saves time in the quality control of a mass production.

What is claimed is:

1. A device for the quality control testing of the galvanic insulation between conducting elements of a printed circuit provided with conducting studs, comprising:

specific sensor means, having an insulating screen provided with individual conducting studs, to be positioned opposed to said printed circuit, wherein each conducting stud of said sensor means registers and is electrically in contact with a single predetermined conducting stud of conducting element of said printed circuit;

scanning means having fixed and separate conducting zones, to be positioned opposed to said individual conducting studs of said specific sensor means and in electrical contact therewith and to be slidably moved thereover, whereby one of said conducting zones, through one of said conducting studs of said sensor means and one of said conducting studs of said printed circuit, may be in electrical contact with another of said conducting zones, through another of said conducting studs of said sensor means and another of said conducting studs of said printed circuit; and indicator means electrically connected between said conducting zones, for detecting an undesirable insulation defect between two of said conducting elements.

2. A device according to claim 1, wherein said insulating screen of said specific sensor means has double-face metallized throughholes for providing said individual conducting studs of said sensor means.

3. A device according to claim 1, wherein said insulating screen of said specific sensor means is a film of supple plastics material.

4. A device according to claim 1, wherein each of said conducting elements of said printed circuit is provided with only one of said conducting studs to be associated with one of said individual conducting studs of said specific sensor means.

5. A device according to claim 1, wherein each of said conducting zones of said scanning means comprises a deformable insulating support superficially metallized.

6. A device according to claim 5, wherein said deformable insulating support is a film of supple plastics material applied onto a face of a compressible support body.

7. A device according to claim 5, wherein said individual conducting studs of said sensor means have a width and said conducting zones of said scanning means are coplanar and have an electrically insulative space therebetween of constant width slightly greater than that of said conducting studs of said sensor means.

8. A device according to claim 6, wherein said supple plastics material of said film of said deformable insulating support is polyimide and said compressible support body is made of polyurethane.

9. A device according to claim 1, wherein said indicator means comprise a megohmmeter.

10. A device for the quality control testing of the galvanic insulation between conducting elements of a printed circuit, card or the like provided with conducting studs, comprising:

specific sensor means, having an insulating screen provided with individual conducting studs, to be positioned opposed to said printed circuit, whereby each and every conducting stud of said sensor means registers and is electrically in contact with a single predetermined conducting stud of different conducting elements of said printed circuit;

scanning means having fixed and separate conducting zones, to be positioned opposed to said individual conducting studs of said specific sensor means and in electrical contact therewith and to be slidably moved thereover, whereby one of said conducting zones, through one of said conducting studs of said sensor means and thus one of said conducting studs of said printed circuit, may come in electrical contact with another of said conducting zones, through another of said conducting studs of said sensor means and associated conducting studs of said printed circuit; and indicator means comprising a source of electricity and an indicator, said source and said indicator being electrically connected in series between said conducting zones, wherein if by suitable movement of said scanning means with respect to sensor means one of said conducting zones through one of said conducting studs of said sensor means and thus one of said conducting studs of said printed circuit card or the like and associated conducting element of said printed circuit card or the like, comes into electrical contact with another of said conducting zones through another of said conducting studs of said sensor means and thus another of said conducting studs and associated conducting element of said printed circuit card or the like, said indicator means will indicate an undesirable insulation defect between two of said conducting elements.

11. A device according to claim 10, wherein said insulating screen of said specific sensor means has double-face metallized throughholes for providing said individual conducting studs of said sensor means.

12. A device according to claim 10, wherein said insulating screen of said specific sensor means is a film of supple plastics material.

13. A device according to claim 10, wherein each of said conducting elements of said printed circuit is provided with only one of said conducting studs to be associated with one of said individual conducting studs of said specific sensor means.

14. A device according to claim 10, wherein each of said conducting zones of said scanning means comprises a deformable insulating support superficially metallized.

15. A device according to claim 14, wherein said deformable insulating support is a film of supple plastics material applied onto a face of a compressible support body.

16. A device according to claim 14, wherein said individual conducting studs of said sensor means have a width and said conducting zones of said scanning means are coplanar and have an electrically insulative space therebetween of constant width slightly greater than that of said conducting studs of said sensor means.

17. A device according to claim 15, wherein said supple plastics material of said film of said deformable insulating support is polyimide and said compressible support body is made of polyurethane.

18. A device according to claim 10, wherein said indicator means comprises a megohmmeter.

19. A device for testing the galvanic insulation between conducting elements of a printed circuit card or the like provided with conducting studs, comprising:
- specific sensor means, said means comprising an insulating screen and a plurality of conducting studs introduced through said screen, of which the number and position of each of said studs coincide individually with the opposed position of any one but only one predetermined conducting stud of separate conducting elements of said printed circuit card or the like;
- each of said conducting studs of said specific sensor means being suitably placed in electrical contact with said opposed predetermined conducting stud of said printed circuit card or the like;
- scanning means, said means comprising at least two fixed separate coplanar conducting zones, and an electrical indicator means, said indicator means comprising a source of electricity and an indicator, said source and said indicator being electrically connected in series between two of said conducting zones, said zones electrically and physically insulated from each other by insulative electrical discontinuity;
- said scanning means being positioned slidably movable with respect to and opposed to said specific sensor means such that each of said conducting zones of said scanning means makes electrical contact with all the conducting studs of said specific sensor means which are opposed to said conducting zone;
- wherein said conducting elements associated with said predetermined conducting studs and said galvanic insulation associated therewith are determined to be correct if said scanning means with respect to said specific sensor means is slidably moved with respect to each other such that said insulative electrocal discontinuity has been opposed to all areas of said specific sensor means without said electrical indicator means indicating any electrical activity and through said indicator.

20. A device for testing a galvanic insulation between conducting elements of a printed circuit card or the like provided with conducting studs, comprising:
- specific sensor means, said means comprising an insulating screen and a plurality of conducting studs introduced through said screen, of which the number and position of each of said studs coincide individually with the opposed position of any one but only one predetermined conducting stud of separate conducting elements of said printed circuit card or the like, each of said conducting studs of said specific sensor means being suitably placed in electrical contact with said opposed predetermined conducting studs of said printed circuit card or the like;
- scanning means, said means comprising at least two fixed separate coplanar conducting zones, and an electrical indicator means, said indicator means comprising a source of electricity and an indicator, said source and said indicator being electrically connected in series between two of said conducting zones, said zones electrically and physically insulated from each other by insulative electrical discontinuity;
- said scanning means being positioned slidably movable with respect to and opposed to said specific sensor means such that each of said conducting zones of said scanning means make electrical contact with all the conducting studs of said specific sensor means which are opposed to said conducting zone;
- wherein certain of said conducting elements associated with said predetermined conducting studs and thus said galvanic insulation associated therewith are determined to have a defect if said scanning means is slidably moved such that said electrical indicator means indicates any electrical activity through said indicator.

* * * * *